United States Patent
da Fonte Dias

(10) Patent No.: US 7,023,373 B2
(45) Date of Patent: Apr. 4, 2006

(54) MULTI-STAGE ADC WITH SHARED AMPLIFIER AND REFERENCE VOLTAGE SELECTION

(75) Inventor: Victor Manuel da Fonte Dias, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/945,689

(22) Filed: Sep. 21, 2004

(65) Prior Publication Data

US 2005/0104762 A1    May 19, 2005

(30) Foreign Application Priority Data

Sep. 24, 2003   (DE) ................. 103 44 354

(51) Int. Cl.
*H03M 1/44* (2006.01)

(52) U.S. Cl. ........................... 341/162; 341/161
(58) Field of Classification Search .............. 341/156, 341/161, 162, 163, 172
See application file for complete search history.

(56) References Cited

U.S. PATENT DOCUMENTS

| 5,764,176 | A | | 6/1998 | Ginetti | |
|---|---|---|---|---|---|
| 5,835,049 | A | | 11/1998 | Nagaraj | |
| 5,861,832 | A | * | 1/1999 | Nagaraj | 341/161 |
| 6,809,677 | B1 | * | 10/2004 | Konno | 341/161 |
| 2005/0116846 | A1 | * | 6/2005 | Bogner | 341/118 |

OTHER PUBLICATIONS

"A 250-mW, 8-b, 52-Msamples/s Parallel-Pipelined A/D Converter with Reduced Number of Amplifiers", Krishnaswamy Nagaraj, H. Scott Fetterman, Joseph Anidjar, Stephen H. Lewis, and Robert G. Renninger, IEEE Journal of Solid-State Circuits, vol. 32, No. 3, Mar., 1997,pp. 312-320.

"A 69mW 10b 80-MS/s Pipelined CMOS ADC", Byung-Moo Min, Peter Kim, David Boisvert and Arlo Aude, IEEE International Solid-State Circuits Conference 2003, 4 pp, no month.

"A 240-Mbps, 1-W CMOS EPRML Read-Channel LSI Chip Using an Interleaved Subranging Pipeline A/D Converter", Tatsuji Matsuura, Takashi Nara, Tatsuya Komatsu, Eiki Imaizumi, Toshihiro Matsutsuru, Ryutaro Horita, Haruto Katsu, Shintaro Suzumura and Kzauo Sato, IEEE Journal of Solid-State Circuits, vol. 33, No. 11, Nov. 1998, pp. 1840-1850.

(Continued)

*Primary Examiner*—Howard L. Williams
(74) *Attorney, Agent, or Firm*—Eschweiler & Associates, LLC

(57) ABSTRACT

The invention provides a clocked analog/digital converter for successive approximation which is designed using a jointly used amplifier and a dynamic range expansion facility by means of a special design for the comparison circuit in the first converter stage. The comparison circuits in the analog/digital converter allow decisions to be made for the further signal processing previously in a preceding time period. Two respective generator circuits in successive converter stages share one amplifier. This reduces the amount of space taken up and current drawn, increases the clock rate and simplifies signal processing for signals with high levels.

19 Claims, 7 Drawing Sheets

OTHER PUBLICATIONS

"Fir Switched-Capacitor Decimator Circuits with Time-Shared Amplifiers", J.E. Franca and V.F. Dias, 30th Midwest Symposium on Circuits and Systems, 1988, pp. 1185-1188, no month.

"Systematic Method for the Design of Multiamplifier Switched-Capacitor FIR Decimator Circuits", J. E. Franca, PhD and V. F. Dias, IEEE Proceedings-G, vol. 138, No. 3, Jun., 1991, pp. 307-314.

"Halbleiterschaltungstechnik", U. Tietze and Ch. Schenk, Springer Publishing, 2002, pp. 1009-1011, no month.

* cited by examiner

FIG 9

| | T0 | | T1 | | T2 | | T3 | | T4 | |
|---|---|---|---|---|---|---|---|---|---|---|
| | P0 | C0 | P1 | C1 | P2 | C2 | P3 | C3 | P4 | C4 |
| φ1 | S 0,9V | S 0,9V | | | | | | | | |
| φ2 | H 0,9V | D 0,75V<0,9V<1V ⇒Overload | | | | | | | | |
| φ3 | | | S 0,9V | S 0,9V | | | | | | |
| | | | H(Overload) 2x0,9V−2Vr =−0,2V | D(Overload) 7/8Vr<0,9V< 9/8Vr ⇒Fuzzy | | | | | | |
| φ4 | | | | | S −0,2V | S −0,2V | | | | |
| | | | | | H(Fuzzy) 2x−0,2V =−0,4V | D(Fuzzy) −0,2V<−1/8Vr ⇒Low | | | | |
| φ5 | | | | | | | S −0,4V | S −0,4V | | |
| | | | | | | | H(Low) 2x−0,4V+Vr =0,2V | D(Low) −5/8Vr<−0,4V <−3/8Vr ⇒Fuzzy | | |
| φ6 | | | | | | | | | S 0,2V | S 0,2V |
| | | ⇒Overload | | ⇒Fuzzy | | ⇒Low | | ⇒Fuzzy | H(Fuzzy) 2·0,2V= 0,4V | D(Fuzzy) 1/8Vr<0,2V ⇒High |
| | | | | | | | | | | ⇒High |

US 7,023,373 B2

MULTI-STAGE ADC WITH SHARED AMPLIFIER AND REFERENCE VOLTAGE SELECTION

REFERENCE TO RELATED APPLICATION

This application claims the benefit of the priority date of German application DE 103 44 354.1, filed on Sep. 24, 2003, the contents of which are herein incorporated by reference in their entirety.

FIELD OF THE INVENTION

The invention relates to an analog/digital converter for converting an analog input signal into a digital value. The invention also relates to a method for operating such an analog/digital converter.

BACKGROUND OF THE INVENTION

Analog/digital converters (ADCs) are key chips, particularly in modern broadband transceivers, for example for the mobile radio standards 802.11a/b (wireless LAN) or UMTS. In this case, analog/digital converters form the interface between the digital and the analog signal processing. The converters convert an analog input signal into a number which is proportional thereto, which is output as a digital signal. The digital signal is frequently a serial sequence of a number of individual binary states, with the assembled binary value of the sequence representing the proportional number. The number of bits per represented digital signal is a measure of the latter's accuracy. An analog/digital converter having an accuracy of 8 bits thus converts an analog input signal into a binary sequence comprising a total of 8 bits. In principle, an analog input range for the analog/digital converter is therefore split into a total of 256 subranges, with each individual subrange, starting at the lowest, being assigned a binary sequence of numbers comprising 8 bits. By way of example, the lowest subrange is thus assigned the decimal value 0, and the highest subrange is assigned the decimal value 255 or, in binary, 11111111. The analog/digital converter now converts the amplitude of the input signal, which is in one of the 256 subranges, into the associated decimal value.

Analog/digital converters are implemented in various ways. One option is to use successive approximation. In this case, the analog/digital converter performs a plurality of individual approximation steps, with a digital subvalue being ascertained in each step and being used to form the digital total value. The number of approximation steps corresponds to the binary accuracy of the digital value. Tietze/Schenk, "Halbleiterschaltungstechnik" [Semiconductor circuitry], 12th edition, Springer 2002, pp. 1009 to 1011 describes a simple example of such an approximation.

One variation of the method described therein compares an input signal or, expediently, the amplitude or the level of an input signal in an approximation step not with a reference voltage, but rather with two reference voltages or with two reference potentials. This ascertains whether the voltage of the input signal is above or below the two reference voltages or whether it is between the two. The input range containing the input signal is therefore divided into a total of three subranges by the two reference voltages in this approximation step, and the comparison ascertains which of these three subranges contains the voltage of the input signal. On the basis of this result, a new signal is produced which is used as an input signal for the subsequent approximation step. In addition, a control signal is generated from the result. This control signal is clearly associated with the range into which the voltage of the input signal has been placed. The control signal is used for forming the digital output value of the analog/digital converter.

Analog/digital converters with successive approximation are expediently designed for a clocked mode of operation and with sample-and-hold circuits. Frequently, each individual approximation step is produced by an individual subcircuit in the analog/digital converter. During a sampling phase, the input signals are sampled in the individual stages of the analog/digital converter. In a holding phase which follows the sampling phase, signal processing takes place, which, inter alia, produces the control signal and also the new signal for the subsequent approximation step or the subsequent stage of the analog/digital converter.

Modern analog/digital converters with a resolution of 10 bits, a bandwidth of 20 MHz and a typical sampling rate of 80 MHz now draw a current of only 23 mA at a supply voltage of 1.5 V. However, the trend toward smaller CMOS technologies between, nowadays, 0.13 mm and 0.08 mm in the near future requires new circuits and extensions in the algorithm in order to prevent the current draw from rising again. In this case, the service life of mobile appliances would also be extended, in particular.

In order to reduce the amount of current draw in analog/digital converters, the printed document "A 250 mW, 8-bit, 52 M Samples/s parallel-pipelined A/D converter with reduced number of amplifiers", IEEE, Journal of Solid State Circuits, vol. 32, No. 3, March 1997 by Nagara et al., and the document "A 69 mW 10 b 80 MS/s Pipeline CMOS ADC", ISSCC 2003/Session 18/Niquist A/D converters/paper 18.4 by Min et al. have described an analog/digital converter in which two successive stages of the analog/digital converter respectively share one amplifier. This allows a more significant reduction in both chip area and current draw. However, a drawback of these circuits is that they are not always able to meet the rising demands for bandwidth and sampling rate. Particularly at high clock rates, the switching times are so short that the switches required therefor can be implemented only with a high level of complexity. In addition, the supply voltage for the exemplary embodiments illustrated needs to be chosen to be very high.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one aspect of the invention, an analog/digital converter is disclosed that draws a small amount of current and is suitable for very high clock rates while concurrently having a small supply voltage. In another aspect of the invention, a method for operating an analog/digital converter is disclosed.

An analog/digital converter for converting an analog input signal into a digital value comprises a first converter stage and a second converter stage, which is connected downstream of the first converter stage. The first converter stage contains an input and a signal output. It has a comparison circuit which is designed to compare a signal amplitude for a signal applied to the input of the first converter stage with the amplitudes of at least two reference signals and to output a control signal to a control output on the first converter stage on the basis of the comparison. The first converter stage also has a generator circuit which is designed to output a signal derived from the signal applied to the input of the first converter stage at an output of the generator circuit.

The second converter stage contains a control input for a first control signal, which control input is connected to the control output of the first converter stage, a signal input for an input signal, which signal input is connected to the signal output of the first converter stage, and a signal output. The second converter stage comprises a comparison circuit and a generator circuit. The comparison circuit is designed to compare a signal amplitude for an input signal applied to the input of the second converter stage with the amplitudes of two reference signals and to output a second control signal to a control output on the second converter stage. The two reference signal amplitudes used for the comparison are determined by the first control signal at the control input. The generator circuit in the second converter stage is designed to output an output signal derived from the input signal at the input of the second converter stage and from the first control signal at the control input of the second converter stage to an output on the generator circuit.

In addition, the analog/digital converter contains at least one amplification device whose input is coupled via a first switching device in a first switching state to the output of the generator circuit in the first converter stage and in a second switching state to the output of the generator circuit in the second converter stage. The output of the amplification device is coupled to the signal output of the first converter stage and to the signal output of the second converter stage. Finally, the analog/digital converter contains an evaluation circuit whose inputs are connected to the control output of the first and second converter stages and which is designed to provide a digital value from the first and second control signals.

The inventive analog/digital converter thus contains an amplification device which can be used both by the first converter stage and by the second converter stage in order to amplify a signal. This allows the total current drawn by the converter to be reduced. In addition, it is possible to reduce the chip area.

In line with the invention, a comparison circuit or means in each converter stage is also used to make a decision about an output signal to be produced by the second converter stage previously in the first converter stage. At the same time, a simple preselection about the reference signal amplitudes to be used by the comparison circuit or means in the second converter stage is made by the control signal from the comparison circuit or means in the first converter stage. As a result, the clock rates in the inventive analog/digital converter can be increased, since in a clocked mode of operation each comparison means now has approximately half the clock period available for the comparison. A suitable choice of reference signal amplitudes in the first converter stage, whose generator circuit outputs a signal applied to the input unchanged at the output, allows the supply voltage to be reduced in the subsequent converter stages.

In a method for operating an analog/digital converter, during a first time period, the first and second switching devices are held in a second switching state. At the same time, during the first time period the generator circuit in the first converter stage samples a signal applied to the signal input of the first converter stage. In addition, during the first time period the output of the generator circuit in the second converter stage outputs a signal which is derived from a control signal at the control input of the second converter stage and from a sampled signal. This signal is amplified by the amplification device and supplied to the signal output of the second converter stage. During a second time period the first and second switching devices are held in the first switching state. At the same time, during the second time period the output of the generator circuit in the first converter stage outputs a derived signal. In this case, the signal is derived from the sampled signal during the first time period. The signal which is output at the output of the generator circuit is amplified by the amplification device and supplied to the signal output of the first converter stage. In addition, during the second time period the signal applied to the input of the second converter stage is sampled by the generator circuit in the second converter stage.

In the inventive method, the amplification device is accordingly used both by the first converter stage and by the second converter stage. This is possible because during a time period one of the generator circuits in the two converter stages samples a signal applied to the input, while the other generator circuit outputs a signal at its output and supplies it to the amplification device.

It is also expedient if during the first time period the comparison circuit in the first converter stage samples a signal applied to the input of the first converter stage. At the same time, during the first time period the comparison circuit in the second converter stage compares a sampled signal with two reference signal amplitudes, the two reference signal amplitudes being determined by a control signal. In addition, during the first time period the comparison circuit in the second converter stage produces a control signal from the comparison and outputs it at the control output of the second converter stage. During the second time period the comparison circuit in the first converter stage compares the signal amplitude of the signal sampled during the first time period with at least two reference signal amplitudes. During the second time period the comparison circuit in the first converter stage additionally produces the control signal from the comparison and outputs it at the control output of the first converter stage.

As a result, during the first time period both the comparison circuit and the generator circuit in the first converter stage sample a signal applied to the input. During the second time period, the comparison circuit is used to generate a control signal and the generator circuit is used to generate an output signal. The output signal is amplified by the amplification device and supplied to the input of the second converter stage.

During this second time period the generator circuit and the comparison circuit in the second converter stage sample this signal applied to the input. In a subsequent time period, which now corresponds to a first time period again, the output of the generator circuit in the second converter stage takes the control signal which was output in the preceding time period as a basis for producing a new signal which is supplied to the amplification device and amplified. At the same time, the comparison circuit in the second converter stage compares the sampled signal with two reference signals, the two reference signals being dependent on the control signal which is output by the comparison circuit in the first converter stage. The sampling phase in one converter stage is therefore the processing phase in the next converter stage. At the same time, the processing phase in one converter stage is the holding phase in the upstream converter stage.

This method allows the clock rate to be increased, since the comparison circuits always have a full time period for their decision making. If a further small period is additionally provided between the two time periods, the switches in the analog/digital converter can be of much simpler design, since the period for the decision making is much longer.

One particularly advantageous development of the method is provided if during the second time period the comparison circuit in the first converter stage compares the signal amplitude of the sampled signal with at least four reference signal amplitudes.

As a result, an input signal range is split by the four reference signal amplitudes into five input subranges, and the comparison circuit in the first converter stage is used to ascertain which subrange contains the signal amplitude of the sampled signal. In this embodiment, the dynamic range of the digital/analog converter is extended. This can significantly reduce the supply voltage for the entire analog/digital converter and particularly for all converter stages downstream of the first converter stage.

It is expedient if the two reference signal amplitudes in the comparison circuit in the second converter stage form a reference signal pair. This is selected from a set of five reference signal pairs during the first time period on the basis of a control signal which is output from the comparison circuit in the first converter stage.

In one example, it is particularly expedient if during the first time period the generator circuit in the second converter stage produces the signal which is derived from the control signal at the control input of the second converter stage and from the sampled signal by virtue of the amplitude of the input signal being doubled or the amplitude of the input signal being doubled and an intermediate signal being added or subtracted thereto/therefrom on the basis of the control signal. In this case, the intermediate signal is derived from the amplitude of a first reference signal or from n times the amplitude of the first reference signal, n being a natural number greater than 1. Instead of the amplitude, the signal level may also be used.

In one development of the inventive method, the reference signal amplitudes used for the comparison comprise a fraction of a first reference signal amplitude. This fraction is respectively m times the eighth part of the first reference signal amplitude, m being an uneven integer between −9 and 9. As a result, a comparison is performed with reference signal amplitudes which have been optimally chosen for this method. It is particularly appropriate if the two reference signal amplitudes have an amplitude or level difference of 2/8 of the first reference signal amplitude.

In another development of the analog/digital converter, the output of the amplification device is coupled via a second switching device in a first switching state to the signal output of the first converter stage and in a second switching state to the signal output of the second converter stage.

In still another development of the analog/digital converter, the two reference signal amplitudes respectively form a reference signal amplitude pair, the comparison circuit in the second converter stage being designed to choose a reference signal amplitude pair from a set of at least five reference signal amplitude pairs. In this case, the choice is based on a control signal applied to the control input of the second converter stage.

In this example, a preselection is thus made for the two reference signal amplitudes. The preselection is in this case dependent on the comparison in the preceding converter stage. The clock rate in the analog/digital converter can thus be increased, since the preselection gives the comparison circuit more time for the comparison which is required.

In one development of the invention, the comparison circuit in the first converter stage has an input range for the input signal which is prescribed by an upper and a lower limit value. In this case, the input range is divided into at least five signal subranges by at least four signal amplitude elements. The comparison circuit is designed for outputting a control signal, the control signal being dependent on which of the at least five signal subranges contains the input signal.

Dividing the input signal range into at least five signal subranges extends the dynamic range of the analog/digital converter. The control signal which is output by the comparison circuit is used in the subsequent converter stage for the preselection. At the same time, extending the dynamic range allows the supply voltages for the subsequent converter stages in the analog/digital converter to be reduced. The power loss is reduced advantageously as a result.

In another development of the invention, the comparison circuit in the at least one second converter stage has a voltage range for the signal applied to the signal input which is prescribed by an upper and a lower limit value. Two voltage signal elements divide the voltage range into three voltage subranges. The comparison circuit in the at least one second converter stage is designed for a comparison and for ascertaining which of the three voltage subranges contains the input signal. Hence, the comparison circuits both in the first converter stage and in the second converter stage are designed for comparing the voltage of the input signal with voltage elements. These ascertain whether the level of the input signal is above the levels of the voltage elements or between two voltage elements. On the basis of such a comparison, the comparison circuits produce a control signal.

In one example, it is expedient for the converter stages to be in the form of sample-and-hold circuits for clocked operation. In this case, it is appropriate if the first and second switching devices are in the second switching state during a first time period and are in the first switching state during a second time period.

This allows the amplification device in the analog/digital converter to be connected both to the first converter stage and to the second converter stage. In other words, the amplification device is used both by the first and by the second converter stage. This allows additional amplification devices, in particular, to be saved in the analog/digital converter, which lowers the amount of current draw.

In this connection, it is appropriate to design the comparison circuit in the second converter stage for sampling a signal applied to the signal input during the first time period and for comparing the level of the sampled signal with the levels of two voltage signal elements in a voltage signal element pair and also for outputting a control signal which is dependent on the comparison during the second time period.

In another development, the comparison circuit in the first converter stage is designed for sampling an input signal during the first time period and for comparing the level of the sampled input signal with the levels of the at least four reference voltages and also for outputting a control signal which is dependent on the comparison during the second time period.

In another exemplary development of the invention, the generator circuits in the first and second converter stages are designed for difference signal processing. Each generator circuit contains a first signal path for a signal element and a second signal path for a signal element which is the inverse of the signal element. The input of the amplification device comprises two connections, and the output of the amplification device comprises two taps. In the first switching state, the first connection and the first tap are connected to the first signal path in the first generator circuit, and the second connection and the second tap are connected to the second signal path in the first generator circuit. In the second switching state, the first connection and the first tap are connected to the second signal path in the second generator circuit, and the second connection and the second tap are connected to the first signal path in the second generator circuit.

In this configuration, during the first switching state the amplification device is connected in the first and second signal paths in the first generator circuit, and in the second switching state it is connected in the signal path in the second generator circuit. One particular advantage of this configuration is that unwanted leakage currents and, in particular, offset currents in the first and second generator circuits compensate for one another.

BRIEF DESCRIPTION OF THE DRAWINGS

The invention is explained in detail below using exemplary embodiments with reference to the drawings, in which:

FIG. 9 shows an exemplary embodiment of the method in the analog/digital converter in accordance with yet another aspect of the invention.

DETAILED DESCRIPTION OF THE INVENTION

Figure 1:
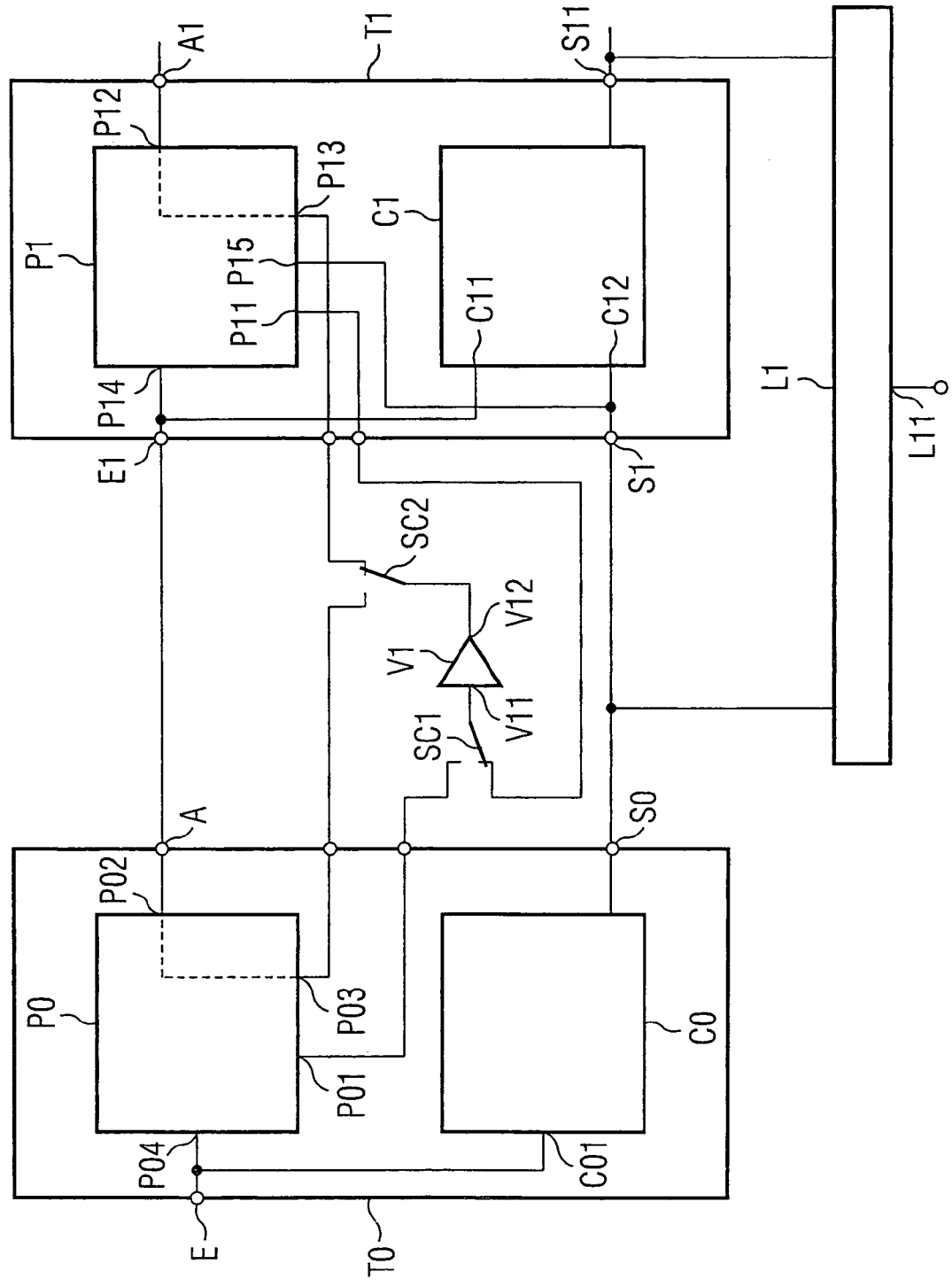
FIG. 1 shows a first block diagram of an analog/digital converter according to one aspect of the invention.

FIG. 1 shows a detail from the first and second converter stages in an analog/digital converter based on the invention. The first converter stage T0 has an input E which is simultaneously the signal input of the analog/digital converter. In addition, the first converter stage T0 contains a signal output A and a control output S0. The input E is connected to a first generator circuit P0 and to a comparison circuit C0. The comparison circuit C0 contains a control output which is connected to the control output of the first converter stage S0. In addition, the first converter stage T0 contains a generator circuit P0 whose input P1 is connected to the input E of the first converter stage T0. The generator circuit P0 has a first output P01 and a second output P02. In addition, the second output PO2 forms the signal output of the first converter stage T0.

The output P01 of the first generator circuit is routed via a switch SC1 to the input V11 of an amplifier circuit V1. The output of the amplifier circuit V12 is connected to a further signal input P03 on the generator circuit P0 via a second switch SC2. As indicated by the dashed line, the input P03 of the first generator circuit P0 is routed to the second output P02 of the generator circuit P0.

The analog/digital converter contains a further converter stage T1. This has a first signal input E1, a control input S1, a control output S11 and a signal output A1. The signal input E1 is connected to the output A of the first converter stage T0, and the control input S1 is connected to the control output S0 of the first converter stage T0. The second converter stage T1 also contains a generator circuit P1 and a comparison circuit C1 whose signal inputs P14 and C11 are connected to the input E1 of the second converter stage T1.

In addition, the comparison circuit C1 in the second converter stage T1 contains a control input C12 which is connected to the control input S1 of the second converter stage T1. Next to this, an output on the comparison circuit C1 in the second converter stage T1 forms the control output S11. The generator circuit P1 has two signal inputs P13 and P14, two signal outputs P11 and P12 and a control input P15. The signal input P14 is connected to the input E1 of the second converter stage T1, and the signal output P12 forms the output A1 of the second converter stage T1. The control input P15 is connected to the control input S1 of the second converter stage T1. The signal output P11 can be connected to the input V11 via the switch SC1, and the signal input P13 can be connected to the output V12 of the amplification device V1 via the switch SC2. In this case too, as indicated, the signal input P13 is connected to the signal output P12 of the generator circuit P1.

In addition, the analog/digital converter comprises a logic circuit L1. A first input on the logic circuit is connected to the output S0 of the first converter stage T0, and a second input is connected to the output S11 of the second converter stage T1. The logic circuit processes the control signals from the two converter stages and produces a digital value therefrom which is output at its output L11.

The amplification device V1 can therefore be used both by the first converter stage T0 in the analog/digital converter and by the second converter stage T1. In one switch position, the switch SC1 connects the input V11 of the amplification device V1 to the output P01 of the first generator circuit P0. At the same time, in this switching state the output of the amplification device V1 is connected to the input P03 of the first generator circuit P0 via the switch SC2. In a second switching state, the switch SC1 connects the input V11 to the signal output P11 of the second generator circuit P1. In this switching state, the switch SC2 likewise connects the output V12 of the amplification device V1 to the signal input P13 of the generator circuit P1 in the second converter stage T1. In other words, in one switching state the amplification device V1 is part of the generator circuit P0, and in the other switching state it is part of the generator circuit P1.

Figure 8:
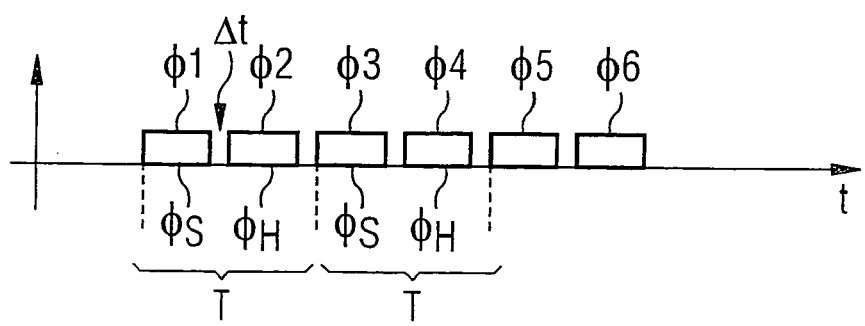
FIG. 8 shows a graph with time phases.

The analog/digital converter shown here converts an analog input signal in an input voltage range between −1 V and +1 V into a corresponding digital value. To this end, it uses a clocked mode of operation which alternately has sampling and holding phases. The time profile for the sampling and holding phases is shown in FIG. 8. Each time period T is divided into a sampling phase ΦS or sampling time period and into a holding phase ΦH or holding time period. Between the sampling phase ΦS and the holding phase ΦH, there is additionally a short time interval ΔT. This is used to provide the switching elements in the individual converter stages of the analog/digital converter with sufficient time for a switching operation between the sampling phase ΦS and the holding phase ΦH. In this time, the switches SC1 and SC2, for example, are switched from one switching state to the other switching state.

The converter stages in the analog/digital converter are designed such that a sampling phase in one converter stage forms the holding phase in the next converter stage. Conversely, the holding phase in one converter stage forms the sampling phase in a subsequent converter stage. The result of this is that the amplification device is always connected to the converter stage which is in a holding phase ΦH.

During a first time period Φ1, which corresponds to the sampling time period ΦS in the first converter stage T0, a signal applied to the input E of the first converter stage T0 is sampled both by the generator circuit P0 and by the comparison circuit C0. During the subsequent holding period ΦH, the comparison circuit C0 compares the level of the sampled signal with the level of reference signals. To this end, it contains a means for providing four voltage elements having the values −0.75 V, −0.25 V, 0.25 V and 0.75 V. The four voltage elements divide the input voltage range between −1 V and +1 V in to a total of five voltage subranges. The comparison circuit C0 has assigned each of these voltage subranges a unique control signal which is provided at the output S0 of the first converter stage T0 by the comparison circuit C0 at the end of the holding period ΦH. Table 1 below shows the individual voltage subranges prescribed by the fixed voltage elements, and the control signals associated with these voltage subranges. The bit sequences associated with the control signals are produced in the logic circuit L1 and contain two respective bit subsequences, the first bit subsequence representing a subvalue and the second bit subsequence providing the information regarding whether the analog voltage value at the input of the analog/digital converter is greater than 0.75 V or less than −0.75 V.

TABLE 1

Voltage subranges for the first comparator circuit C0, the associated control signals and the bit subsequences

| Voltage subrange | Control signal | Bit sequence |
| --- | --- | --- |
| 1 V to 0.75 V | "Overload" | (0, 0), (0, 1) |
| 0.75 V to 0.25 V | "High" | (1, 0), (0, 0) |
| 0.25 V to −0.25 V | "Fuzzy" | (0, 1), (0, 0) |
| −0.25 V to −0.75 V | "Low" | (0, 0), (0, 0) |
| −0.75 V to −1 V | "Underload" | (0, 0), (1, 0) |

During the holding phase ΦH, the comparison circuit C0 thus makes a decision about which of the five voltage subranges contains the level of the input signal, and produces the associated control signal, which is output at the output S0 of the first converter stage T0.

At the same time, during the holding phase the output P01 of the generator circuit P0 is connected to the input of the amplification circuit V1. The second input P03 is coupled to the output of the amplifier device V1 via the second switches SC2. The amplification device amplifies the signal provided at the output P01 in a suitable manner and supplies it to the output of the first converter stage T0. The generator circuit P0, together with the amplifier V1, is in a form such that during the holding period it outputs a signal which has the same level as the signal in the preceding sampling time period.

During the holding phase ΦH in the first converter stage T0, the signal provided at the output A of the first converter stage is sampled by the generator circuit P1 and the comparison circuit C1 in the second converter stage T1. At the end of the holding phase ΦH in the first converter stage T0 the control signal is output by the comparison circuit C0. This control signal applied to the input C12 is used by the comparison circuit C1 to select a reference voltage pair. The comparison circuit C1 in the converter stage T1 is in a form such that it takes a control signal at the control input as a basis for selecting a reference voltage pair from a set of a total of five reference voltage pairs.

Each reference voltage pair contains two reference voltage elements. These are each n/8 of a first reference voltage VREF, n being an uneven natural number. The difference between two reference voltage elements in each reference voltage pair is respectively 2/8 VREF. In the exemplary embodiment, the reference voltage VREF is 1V. An overview of the reference voltage elements in each reference voltage pair and values associated with the voltage subranges which can be derived therefrom is given in Table 2.

TABLE 2

Overview of the reference voltage pairs and the voltage subranges with the associated control signals

| Reference voltage pair | | Voltage subranges [$V_{REF}$] | Control signal | Bit sequence |
| --- | --- | --- | --- | --- |
| SI1 | (7/8, 9/8) | — | — | — |
| | | [7/8, 9/8] | Fuzzy | (0, 1) |
| | | <7/8 | Low | (0, 0) |
| SI2 | (5/8, 3/8) | >5/8 | High | (1, 0) |
| | | [3/8, 5/8] | Fuzzy | (0, 1) |
| | | <3/8 | Low | (0, 0) |
| SI3 | (1/8, −1/8) | >1/8 | High | (1, 0) |
| | | [−1/8, 1/8] | Fuzzy | (0, 1) |
| | | <−1/8 | Low | (0, 0) |
| SI4 | (−3/8, −5/8) | >−3/8 | High | (1, 0) |
| | | [−5/8, −3/8] | Fuzzy | (0, 1) |
| | | <−5/8 | Low | (0, 0) |
| SI5 | (−7/8, −9/8) | >−7/8 | High | (1, 0) |
| | | [−9/8, −7/8] | Fuzzy | (0, 1) |
| | | — | — | — |

The input voltage range for an input signal at the input E1 of the second converter stage T1 is likewise in the range between −1 V and +1 V. The two reference voltage elements in a selected reference voltage pair therefore divide the input voltage range into three respective voltage subranges. By way of example, the comparison circuit C1 produces a reference voltage pair comprising the reference voltage elements +1/8 V and −1/8 V for a control signal "Fuzzy". These two reference voltage elements divide the input range into a range above 1/8 V, a range between −1/8 V and +1/8 V and into a range below −1/8 V.

In the holding phase ΦH following the sampling phase ΦS in the comparison circuit C1, the latter compares whether the sampled input signal is above 1/8 VREF, is in the range between −1/8 V and +1/8 VREF or is below −1/8 VREF. On the basis of the result of such a comparison, the comparison circuit C1 produces one of the control signals in column three of table 2 at the end of the holding phase and outputs it at the output S11 of the first converter stage T1. In this case, the control signal may assume the three possible values. If the result of the comparison is that the level is above 1/8 V, that is to say the level is in the range with the larger reference voltage element as the lower limit value, then the associated value "High" is used as the control signal. If the level is in the range between the reference voltage elements, then the associated value "Fuzzy" is used as the control signal, and the associated value "Low" is used as the control signal if the level is in the range with the smaller reference voltage element as the upper limit value.

In the exemplary embodiment illustrated, the control signals "High" for the reference voltage pair (7/8, 9/8) and the control signals "Low" for the reference voltage pair (−7/8 V, −9/8 V) are dispensed with, since the level of an input signal at the input E1 of the first converter stage cannot become higher than 1 V. The selection of a reference voltage pair for the comparison circuit C11 is made dynamically using a control signal from the comparison circuit C0 in the sampling phase which precedes the holding phase in the comparison circuit C1. The control signals from the comparison circuits C0 and C1 are needed not only for selecting the reference voltage pair but also for producing a new signal in a downstream converter stage, and the digital value from the logic circuit L1.

The control signal produced by the comparison circuit C0 is also applied to the input P15 of the first generator circuit P1. The subsequent holding phase ΦH in the generator circuit P1 corresponds to a sampling phase ΦS in the preceding converter stage T0. In the holding period ΦH in the generator circuit P1, the output P11 of the generator circuit P1 is connected to the input V11 of the amplification device V1 via the switch SC1. The output of the amplification device V1 is in turn connected to the input P13 of the generator circuit P1 via the switch SC2. Using the amplification device V1, the generator circuit P1 uses the control signal at the control input S1 of the first converter stage T1 and the signal VI sampled in the preceding sampling period ΦS to produce a new signal and outputs this signal at the output A1 of the first converter stage T1. The output signal produced on the basis of the control signal is shown in table 3.

TABLE 3

Control signal and the output voltage produced therefrom in the generator circuit

| Control signal | Generated output voltage |
|---|---|
| "Overload" | $2 * V_I - 2 V_{REF}$ |
| "High" | $2 * V_I - V_{REF}$ |
| "Fuzzy" | $2 * V_I$ |
| "Low" | $2 * V_I + V_{REF}$ |
| "Underload" | $2 * V_I + 2 V_{REF}$ |

In this case, the level of the sampled signal VI is always doubled and the control signal is taken as a basis for adding or subtracting a level for a reference voltage VREF=1V. If the control signal produced by the comparison circuit is the signal "Overload", double the reference voltage is subtracted, and the signal "Underload" involves double the reference voltage being added.

Figure 2:
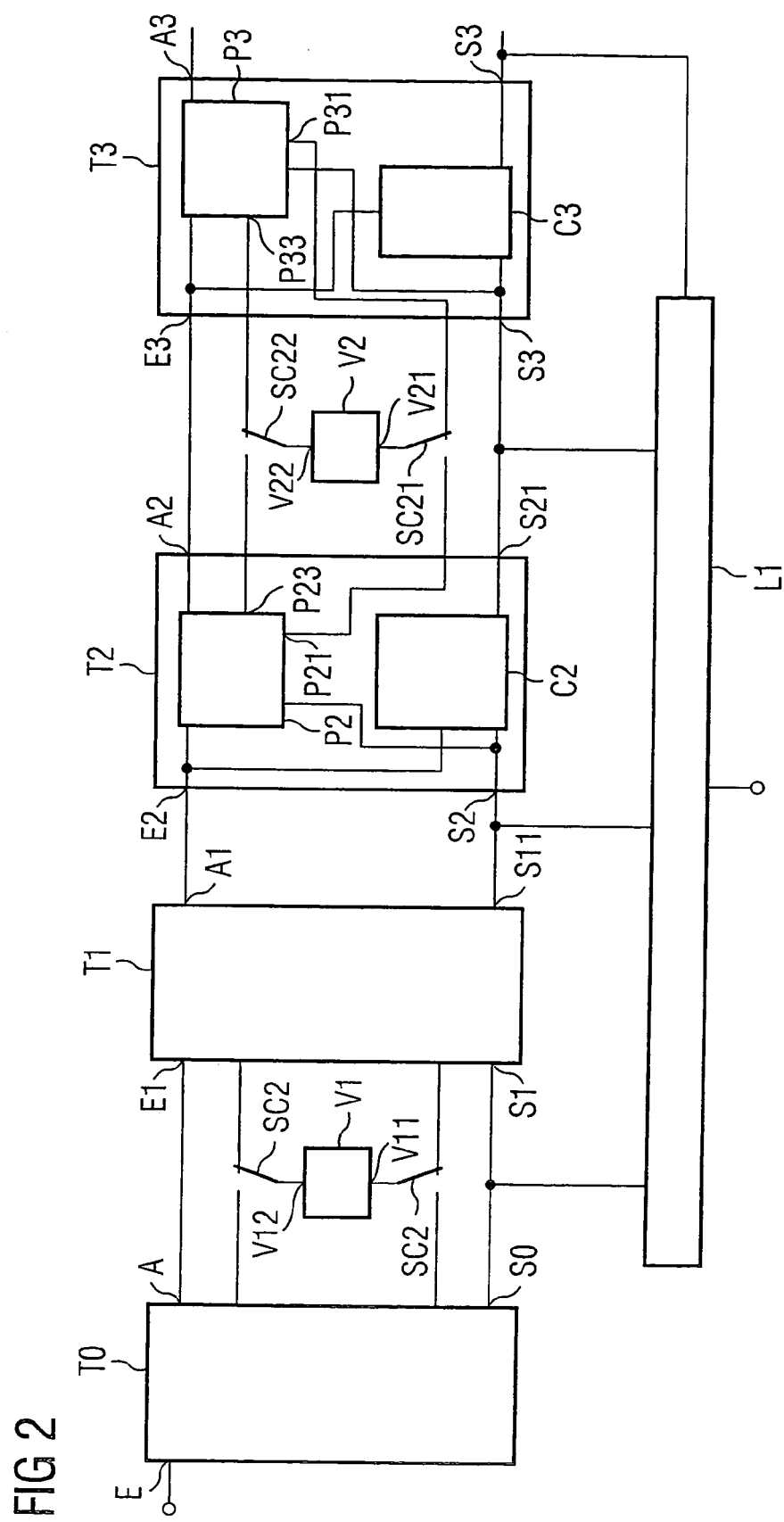
FIG. 2 shows a second block diagram of an analog/digital converter according to another aspect of the invention.

The detail from an analog/digital converter which is shown in FIG. 1 can be extended by adding further converter stages. A detail from an analog/digital converter with a total of four converter stages is shown in FIG. 2. In this case, identical components bear the same reference symbols. In this context, the converter stages T0 and T1 are designed in the same way as the converter stages T0 and T1 in the detail from an analog/digital converter based on the invention which is shown in FIG. 1. In this case, they contain generator and comparison circuits P0, P1 and C0 and C1 which are no longer shown.

The output A1 of the second converter stage T1 is connected to the input E2 of a third converter stage T2. A control input S2 on the third converter stage T2 is connected to the control output S11 of the second converter stage T1. An input E3 on a fourth converter stage T3 is connected to the output A2 of the third converter stage T2, and a control input S3 on a fourth converter stage T3 is connected to the control output S21 of the third converter stage T2. In addition, a further amplification device V2 is provided between the third converter stage T2 and the fourth converter stage T3.

In this case too, a switch SC21 couples the input V21 of the second amplification device V2 either to the output P21 of the generator circuit P2 in the third converter stage T2 or to the output P31 of the generator circuit P3 in the fourth converter stage T3. The output V22 of the amplification device V2 can be connected by means of the second switching device SC22 either to the input P23 of the generator circuit P2 or to the input P33 of the generator circuit P3. Hence, two generator circuits in two successive converter stages always share one amplification device.

The analog/digital converter shown in FIG. 2 can be extended as desired by adding further stages. The way in which it works remains the same. During a first time period, the generator circuits and the comparison circuits in the converter stages T0, T2 and in all further even-numbered converter stages sample a signal applied to the input. At the same time, the generator circuits in the converter stages T1 and T3 and in the further uneven-numbered converter stages produce an output signal on the basis of a signal sampled by them in the preceding time period and a control signal. During the second time period, the comparison circuits in the converter stages T1 and T3 compare the sampled signal with the two reference signals and, on the basis thereof, produce a new control signal at the end of the period. This signal is needed by the subsequent converter stages in the next time phase for the operations of production and comparison.

Figure 3:
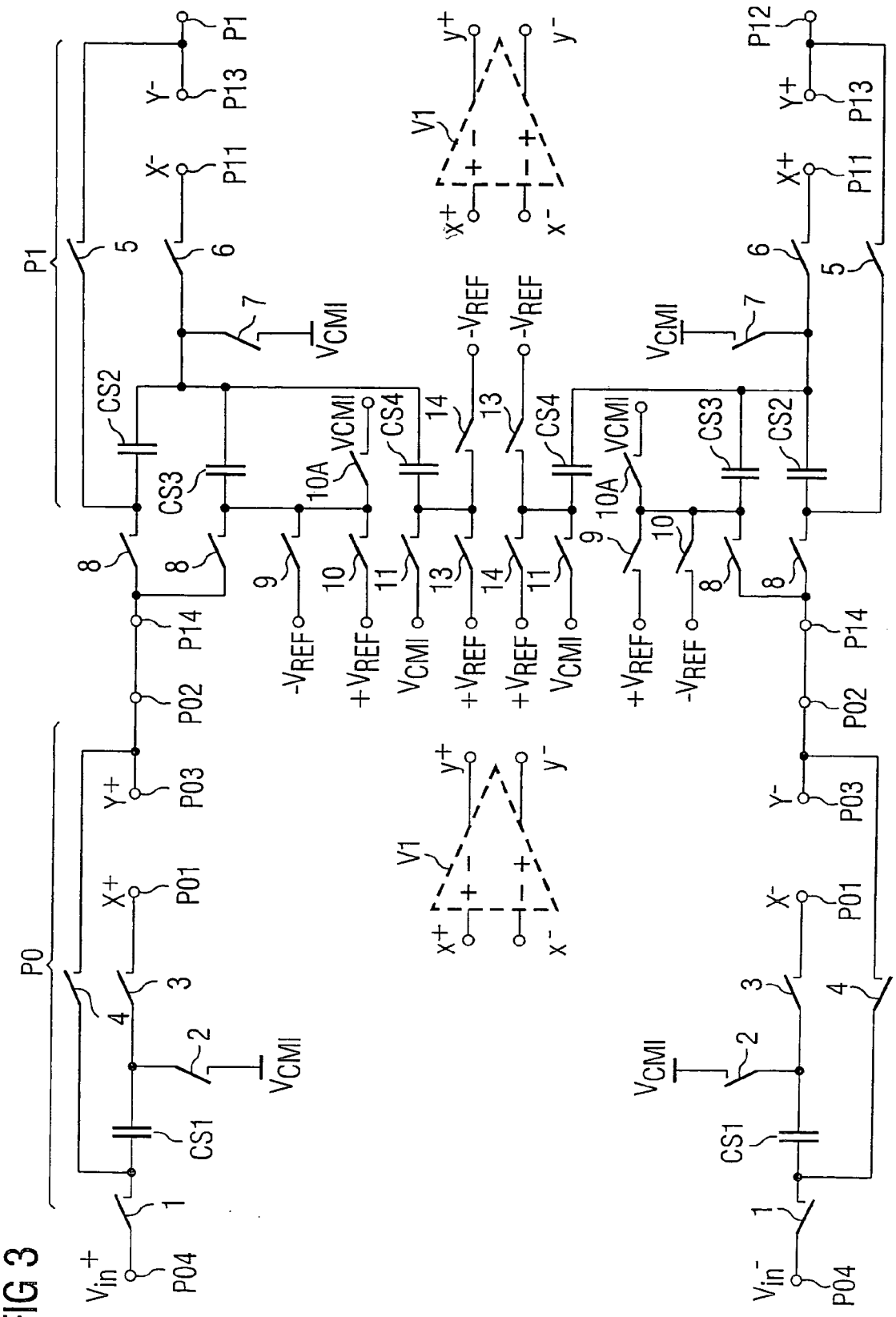
FIG. 3 shows an exemplary generator circuit in the first and second converter stages of an analog/digital converter according to the invention.

A block diagram of the generator circuit P0 in the first converter stage T0 and of the generator circuit P1 in the second converter stage T1 is shown in FIG. 3. In this exemplary embodiment, the generator circuits are designed for difference signal processing. The two generator circuits thus contain two signal paths. A positive signal path carries a signal VIN+, and the second, negative signal path carries the associated difference signal VIN−.

The input P04 of the first generator circuit P0 has two connections for difference signals. One of the connections carries the signal VIN+, and the other carries the associated difference signal VIN−. The two signal paths are designed symmetrically with respect to one another. The input P04 is connected to a respective connection on a respective capacitor CS1 via a switch 1 and additionally to the output PO2 and to the signal input P03 of the generator circuit via a respective second switch 4. The respective second connection of the capacitor CS1 both in the first and in the second signal path is coupled to the potential VCMI via a respective switch 2 and to the output P01 via a respective switch 3.

The tap X+ at the output P01 is routed, as indicated here, to the non-inverting input x+ of the jointly used amplifier V1. The tap X− at the output P01 is connected to the inverting input x− of the amplifier V1. The non-inverting and inverting outputs y+ and y− of the amplifier V1 are connected to the connection Y+ at the input P03 and to the connection Y− at the input P03, respectively.

The two taps at the output P02 of the generator circuit P0, which also form the output of the first converter stage T0, are connected to the input E1 and to the input P14 of the second converter stage T1. The two input connections at the input P14 are connected to a respective first connection on a capacitor CS2 via a respective switch 8 and, via a respective switch 5, to the two taps at the output P12 and to the connections at the input P13.

A respective second switch 8 connects the two connections at the input 14 to a first connection on a further capacitor CS3. The first connection of the capacitor CS3 in the first, positive signal path can also be connected to a reference potential −VREF via a switch 9, to a reference potential +VREF via a switch 10 and to the potential VCMI via a switch 10A. The first connection of the capacitor CS3 in the second, negative signal path is connected to the reference potential −VREF via a second switch 10, to the reference potential +VREF via a second switch 9 and to the potential VCMI via a second switch 10A.

The second connection of the capacitor CS2 in the positive signal path is connected to the second connection of the capacitor CS3 in the first, positive signal path, to a supply potential VCMI via a first switch 7, to a tap X− of the signal output P11 via a first switch 6, and to a first connection on a further capacitor CS4. The second connection of the capacitor CS4 can be coupled to a potential VCMI via a switch 11, to the reference potential +VREF via a switch 13 and to the reference potential −VREF via a switch 14.

The second signal path is designed in a similar manner. The second connection of the capacitor CS2 in the second, negative signal path is connected to the second tap X+ at the output P11 via the switch 6, to the potential V VCMI via the switch 7 and to the second connection of the capacitor CS4 in the second signal path. In addition, the second connection of the capacitor CS2 is routed to a first connection on a further capacitor CS4. The second connection of the further capacitor CS4 is connected to the supply potential VCMI via a second switch 11, to the reference potential −VREF via a second switch 13, and to the reference potential +VREF via a second switch 14.

The first tap X− in the positive signal path at the output P11 is then connected to the inverting input x− of the amplifier V1. At the same time, the tap X+ in the second signal path at the output P11 is coupled to the non-inverting input x+ of the amplifier V1. A first output y+ on the amplifier V1 is routed to the connection Y+ in the second, negative signal path at the input P13 of the generator circuit P1. At the same time, the output y− is coupled to the connection Y− in the positive signal path of the input P13. The two inputs of the amplifier V1 are thus cross coupled to the two outputs P01 of the first generator circuit P0 and P11 of the second generator circuit P1. At the same time, the two outputs y+ and y− of the amplifier V1 are cross coupled to the two input connections P03 and P13.

The switches 3, 4, 5 and 6 form the switches SC1 and SC2 in FIG. 1. On the basis of time, 3 and 4 or 5 and 6 are closed, which means that the amplifier is always connected to one of the two circuits.

A first time period Φ1 corresponds to a sampling phase ΦS in the first generator circuit P0. The first time phase Φ1 also represents a holding phase ΦH in the second generator circuit P1. During the sampling phase ΦS, the switches 1 and the switches 2 in the first generator circuit P0 are closed. The capacitors CS1 in the two signal paths are charged to a voltage which corresponds to the level of the signal applied to the input. In the second time period Φ2, which corresponds to the subsequent holding phase ΦH in the first generator circuit, the two switches 1 and 2 are opened again and the switches 3 and 4 are closed. This means that the two inputs of the amplifier V1 are connected to a respective tap at the output P01 of the amplifier arrangement P0. At the same time, the switches 5 and 6 are open. A respective output on the amplifier V1 is now coupled to a connection at the input P03. In this case, the output y+ of the amplifier V1 is connected to the first connection Y+ at the input P03, and the output y− is connected to the connection Y− in the negative signal path. The amplification device is now used to hold the signal sampled in the preceding sampling phase ΦS and to output it at the output P02.

The second time period Φ2 is also a sampling phase ΦS in the second generator circuit P1. In this sampling phase, the two switches 8, the switch 7 and the switch 11 in the first and second signal paths of the generator circuit P1 are closed. The sampled signal held by the amplification device V1 is sampled by the generator circuit P1.

In a subsequent third time period, the sampled signal is now held by the generator circuit P1. To this end, the input x+ of the amplifier V1 is connected via the switch SC1 to the tap X+ at the output P11 of the negative signal path, and the inverting input x− of the amplifier V1 is connected to the tap X− in the first signal path at the output P11. The output y+ of the amplifier V1 is connected to the connection Y+ in the second signal path, and the output y− is connected to the connection Y− at the input P13. At the same time, the switches 8, 7 and 11 are open, and the switches 6 and 5 are closed. In addition, a control signal from the comparison circuit C0 in the first converter stage T0 is taken as a basis for closing one of the switches 9, 10, 11, 13 or 14. As a result, the level of the output signal is altered by doubling the level of the sampled signal, and then adding or subtracting the level of the reference potential VREF or the double level of the reference potential VREF. At the output P12 of the second generator circuit P1, the amplifier V1 outputs a signal which is derived therefrom. An overview of the output levels as a function of the control signal with the associated closed switches during the holding phase ΦH in the second generator circuit P1 is shown in table 4 below.

TABLE 4

Switch position during a holding phase, and the output voltage generated therefrom in the second generator circuit

| Control signal | Closed switches | Generated output voltage |
|---|---|---|
| "Overload" | 9, 14, 6, 5 | $2 * V_I - 2V_{REF}$ |
| "High" | 9, 11, 6, 5 | $2 * V_I - V_{REF}$ |
| "Fuzzy" | 11, 10A, 6, 5 | $2 * V_I$ |
| "Low" | 10, 11, 6, 5 | $2 * V_I + V_{REF}$ |
| "Underload" | 10, 13, 6, 5 | $2 * V_I + 2V_{REF}$ |

During the third time period F3, which corresponds to a holding phase ΦH in the second generator circuit P1, the generator circuit P0 additionally samples a signal again. A sampling phase in one generator circuit is therefore a holding phase in the next or in the preceding generator circuit.

Figure 7:
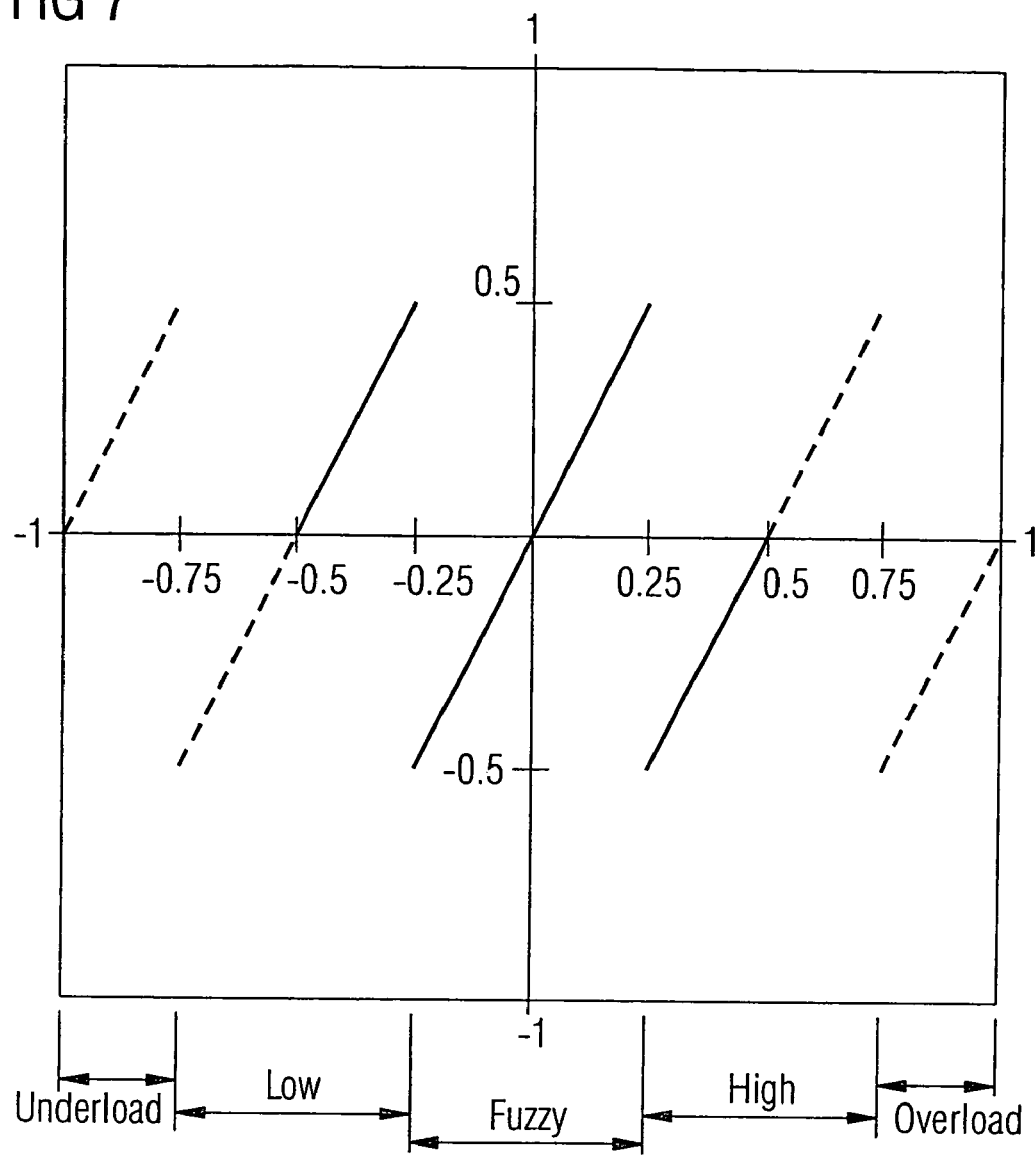
FIG. 7 shows a voltage graph to illustrate the input and output voltages according to one aspect of the invention.

The transfer characteristic for the second generator circuit P1 as a function of the input signal is shown in FIG. 7. Plotted on the abscissa is the maximum input range between −1 V and +1 V. As already mentioned, this range is divided by the total of four voltage elements into five subranges, which are denoted, starting with the lowest, by the terms "Underload", "Low", "Fuzzy", "High", "Overload". The levels of the voltages at the subrange boundaries are the same as the levels which are used for the comparison in the comparison circuit C0 in the first converter stage T0. The ordinate shows the output signal from the second generator circuit P1. An input signal in the range between −1 and +1 V is always converted into an output signal in the range between −0.5 and 0.5 V by the second generator circuit. The result of this is that subsequent converter stages now only ever need to process signals in this level range. This makes it possible to reduce the supply voltage for the amplifiers in the generator circuits. The design of the comparison circuits is also simplified considerably.

Figure 4:
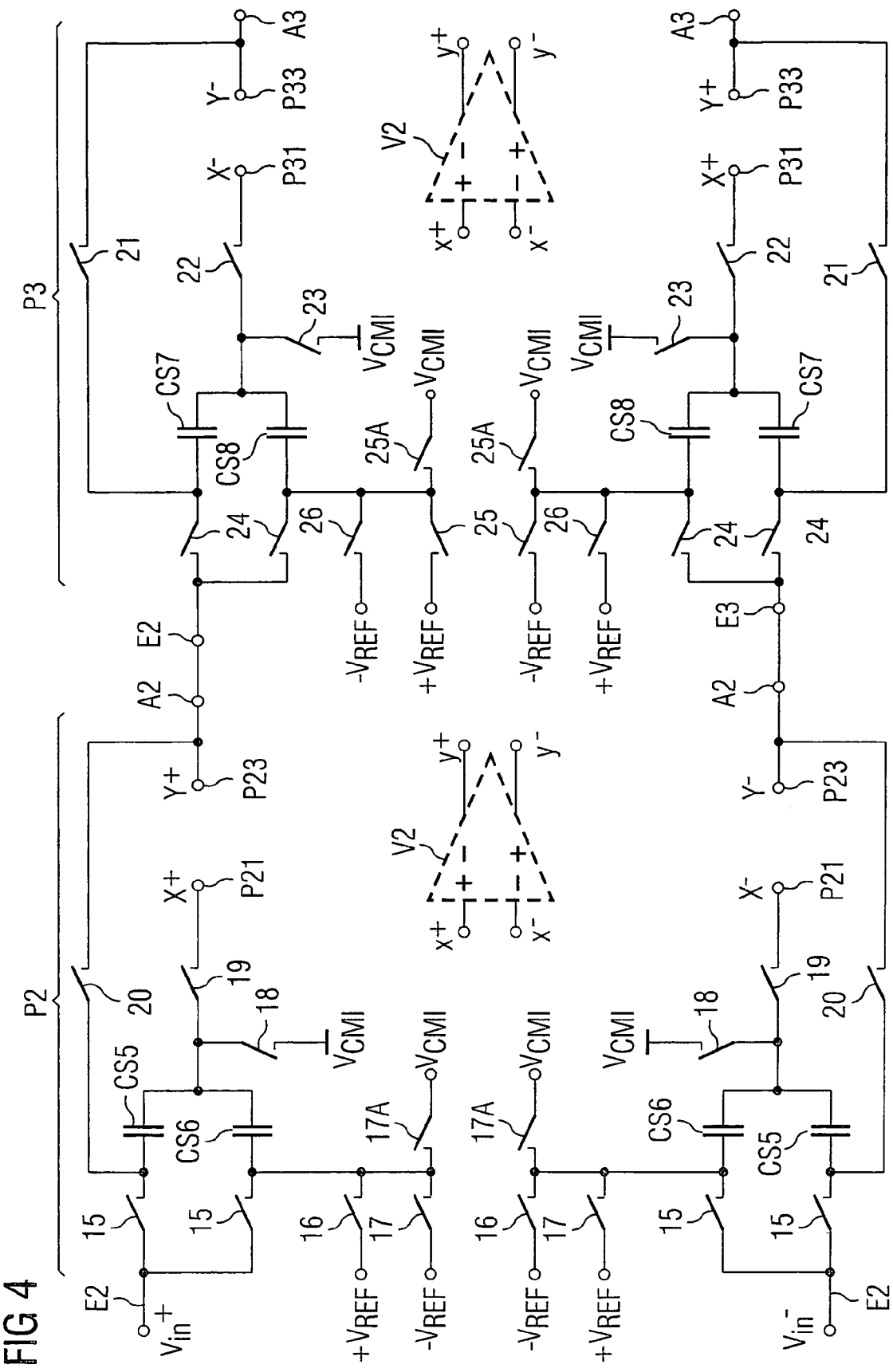
FIG. 4 shows an exemplary generator circuit in the third and fourth converter stages of an analog/digital converter according to the invention.

FIG. 4 shows the two generator circuits P2 and P3 in the third and fourth converter stages T3, T4 of the analog/digital converter. In this case, the input of the generator circuit P2 is simultaneously the input E2 of the third converter stage T2 and is connected to the output A1 of the second converter stage T1 or to the output P12 of the second generator circuit P1. The two generator circuits are constructed in a similar manner. The positive signal path for the signal VIN+ and the negative signal path for the signal VIN− at the respective input are routed via two respective switches 15 and 24 to a respective capacitor CS5 and CS6 or CS7 and CS8. In addition, a first connection on the capacitors CS5 and CS7 is connected via a switch 20 or 21 to the output A2 or A3 and to the input P23 or P33 of the generator circuits. The respective second connection of the capacitors CS5 is respectively connected to the second connection of the capacitor CS6. The respective second connection of the capacitors CS7 is connected to the respective second connection of the capacitors CS8.

The second connection of the capacitor CS5 in the positive signal path is connected via a first switch 19 to the tap X+ at the output P21 and via a first switch 18 to the supply potential VCMI. The second connection of the capacitor CS5 in the negative signal path is connected via a second switch 18 to the potential VCMI and via a second switch 19 to the tap X− at the output P21. The first connection of the capacitor CS6 in the positive signal path may, furthermore, be coupled by means of a first switch 16 to the reference potential +VREF, by means of a first switch 17 to the reference potential −VREF and by means of a first switch 17A to the potential VCMI. The first connection of the capacitor CS6 in the negative signal path is connected via a second switch 16 to the reference potential −VREF, via a second switch 17 to the reference potential +VREF and via a second switch 17A to the potential VCMI.

The second connection of the capacitor CS7 in the positive signal path of the generator circuit P3 is routed via a first switch 22 to the tap X− at the output P31 and via a first switch 23 to the supply potential VCMI. The capacitor CS7 in the negative signal path of the generator circuit P3 can be coupled by means of a second switch 23 to the supply potential VCMI and by means of a second switch 22 to a tap X+ at the output P31. The first connection of the capacitor CS8 in the positive signal path is likewise connected via a first switch 26 to the reference potential −VREF, via a second switch 25 to the reference potential +VREF and via a first switch 25A to the potential VCMI. The first connection of the capacitor CS8 in the negative signal path is connected to a second switch 25, to a second switch 26 and to a second switch 25A. These connect the potential +VREF, −VREF or VCMI to the first connection of the capacitor CS8.

In this case too, as indicated, the shared amplifier V2 is connected to the two taps X+ and X− at the outputs P21 and P31 and to the two connections Y+ and Y− at the inputs P23 and P33. The switch position of the switches 19, 20 and 21, 22 connect the inputs of the amplifier either to the generator circuit P2 or to P3.

The third and fourth generator circuits P2 and P3 are likewise in the form of a sample-and-hold circuit. During a sampling phase ΦS, the switches 15 and 18 in the third generator circuit P2 are closed, and the switches 16 and 17 and also 19 and 20 are open. During the sampling period ΦS, which corresponds to the holding period ΦH in the generator circuit P1 in the second converter stage T1, the difference signal VIN+ and VIN− applied to the input is sampled and is stored in the capacitors CS5 and CS6. The subsequent holding phase ΦH in the generator circuit P2 corresponds to the sampling period ΦS in the generator circuit P3. During the holding phase ΦH in P2, the switches 15, 18 are open and the switches 19, 20 are closed. In addition, depending on the control signal from the comparison circuit in the first converter stage T1, one of the switches 16 or 17 is closed. The output of the A2 of the generator circuit P2 therefore produces a signal which corresponds to the double level input signal VIN or to the double level of the input signal VIN plus or minus the level of the reference signal VREF.

Furthermore, during the holding period ΦH in the generator circuit P2 the switches 24 and 23 in the generator circuit P3 are closed. The switches 21, 22 and also 25 and 26 in the generator circuit P3 are open during the sampling phase ΦH in the generator circuit P2. The holding period ΦH in the generator circuit P2 is the sampling period ΦS in the generator circuit P3. In the subsequent holding phase ΦH in the generator circuit P3, which simultaneously represents a fresh sampling phase ΦS in the generator circuit P2, the amplifier V2 is connected to the output P31 or to the input P33 of the generator circuit P3.

The switches 24 and 23 are open and the switches 22 and 21 are closed. In addition, depending on the control signal from the comparison circuit C2 in the preceding converter stage T2, one of the switches 25 or 26 is closed. The generator circuit P3 thus generates a derived signal which is dependent on the input signal and on the control signal, and outputs this derived signal at the output A3 during its holding phase.

As can be seen in FIG. 4, the amplifier circuit V2 in the generator circuit P3 is cross connected to the inputs and the outputs in comparison with the generator circuit P2. The amplifier device V1 jointly used by the generator circuit P0 and the generator circuit P1 is also cross connected in the generator circuit P1 to the taps X− and X+ at the output P11 and to the connections Y+ and Y− at the input P13.

The background to such connections is primarily the possibility of reducing the influence of a possible offset voltage, which would add up, and not compensate for itself, in the case of a normal connection between the generator circuit and the amplifier. This will be shown by way of example using the generator circuit P2 and P3. During a holding phase in the generator circuit P2, the output level VOUT+ and VOUT− in the generator circuit P2 is equal to $$VOUT+(P2)=2VIN+-VREF(P2)+VOffset(P2)$$

and $VOUT-(P2)=-2VIN-+VREF(P2)-VOffset(P2)$

In this case, the reference signal is $$VOUT+(P2)-VOUT-(P2)=4VIN-2VREF(P2)+2VOffset(P2)$$

In this context, the difference is proportional to twice a possible offset voltage. The output signal from the generator circuit P3 is obtained as $$V\text{OUT}+(P3)=2V\text{IN}+(P3)-V\text{REF}(P3)+V\text{Offset}(P3)$$

$$V\text{OUT}-(P3)=-2V\text{IN}-(P3)+V\text{REF}(P3)-V\text{Offset}(P3)$$

Since the same amplifier is used for the generator circuits P2 and P3, the offset voltage is the same. The cross connection of the amplifier device V2 in the generator circuit P3 means that the input signal for the third generator circuit in the positive signal path is the same as the output signal from the negative signal path in the second generator circuit, and the input signal for the third generator circuit in the negative signal path is the same as the output signal in the positive signal path in the second generator circuit:

$$V\text{IN}+(P3)=V\text{OUT}-(P2), V\text{IN}-(P3)=V\text{OUT}+(P2)$$

The overall result for the output signal from the third generator circuit at the output A3 for the positive signal path is the voltage $$V\text{OUT}+(P3)=4V\text{IN}-+2V\text{REF}(P2)-V\text{REF}(P3)-V\text{offset}$$

and for the negative signal path $$V\text{OUT}-=4V\text{IN}+-2V\text{REF}(P2)+V\text{REF}(P3)+V\text{Offset}.$$

In this case too the difference signal is also proportional to twice an offset voltage. The offset voltage therefore remains constant.

If, by contrast, the amplifier circuit V2 in the third generator circuit P3 is not cross connected, then a rising offset voltage is obtained in each amplifier stage. This results in a reduction in the power of the individual converter stages in the analog/digital converter.

Besides the generator circuits, each converter stage in the analog/digital converter contains a comparison circuit. This circuit is likewise in the form of a sample-and-hold circuit. In the exemplary embodiment, its sampling period matches the sampling period of the corresponding generator circuit in the converter stage.

Figure 6:
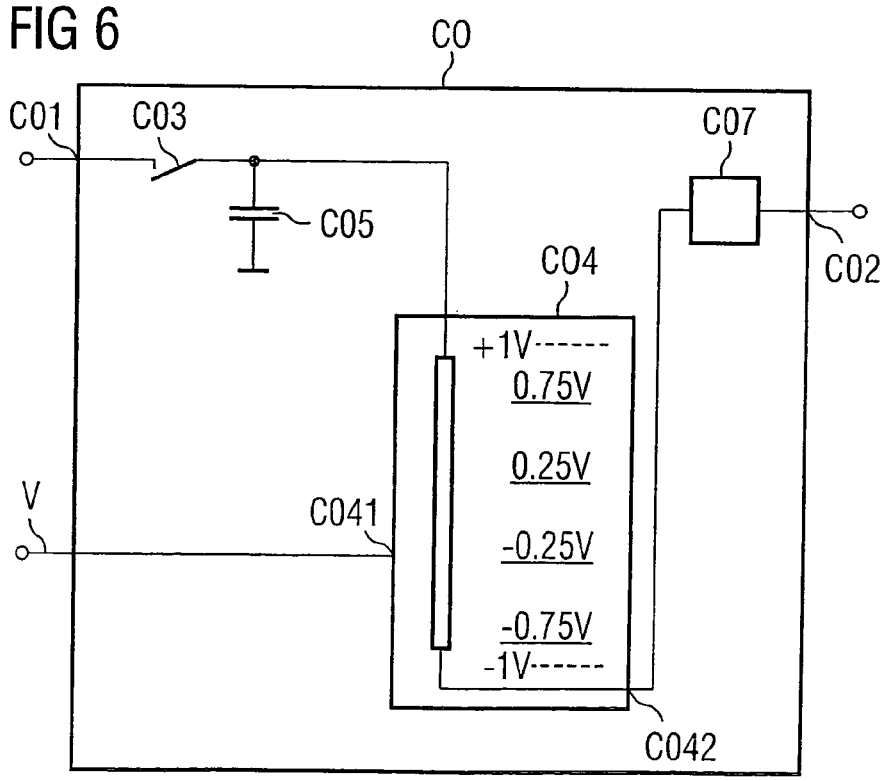
FIG. 6 shows a block diagram of a comparison circuit in the first converter stage according to an aspect of the invention.

FIG. 6 shows the comparison system or means C0 in the first converter stage T0. The input C01 is connected via a switch C03 to a first connection on a capacitor C05. In the exemplary embodiment, the second connection of the capacitor C05 is connected to ground. In addition, the first connection of the capacitor C05 is routed to an input on the actual comparison circuit C04. The comparison circuit C04 has a supply input C041 to which a potential or a voltage is applied. The comparison circuit C04 has a means which uses the supply voltage V in an appropriate manner to divide an input voltage range between −1 V and +1 V by four voltage elements −0.75 V, −0.25 V, 0.25 V and 0.75 V into a total of five voltage subranges. A signal output C042 on the comparison circuit C04 is routed to a control circuit C07 which produces a control signal and outputs it at the output C02.

During the sampling phase ΦS, the switch C03 is closed and the capacitor C05 is charged using the input signal. In the holding phase ΦH, the switch C03 is open. The comparison circuit C04 compares the level of the sampled signal stored in the capacitor C05 with the four voltage signal elements. The level of the sampled signal is in this case either in one of the three ranges between the four voltage subranges or below the lowest voltage subvalue or above the highest voltage subvalue. The comparison circuit therefore ascertains which of the five voltage subranges contains the level of the sampled signal. The signal generated therefrom is output at the output C04 in the course of the holding phase and is supplied to the device C07. The device C07 produces a control signal therefrom, which is output at the control output C02.

Figure 5:
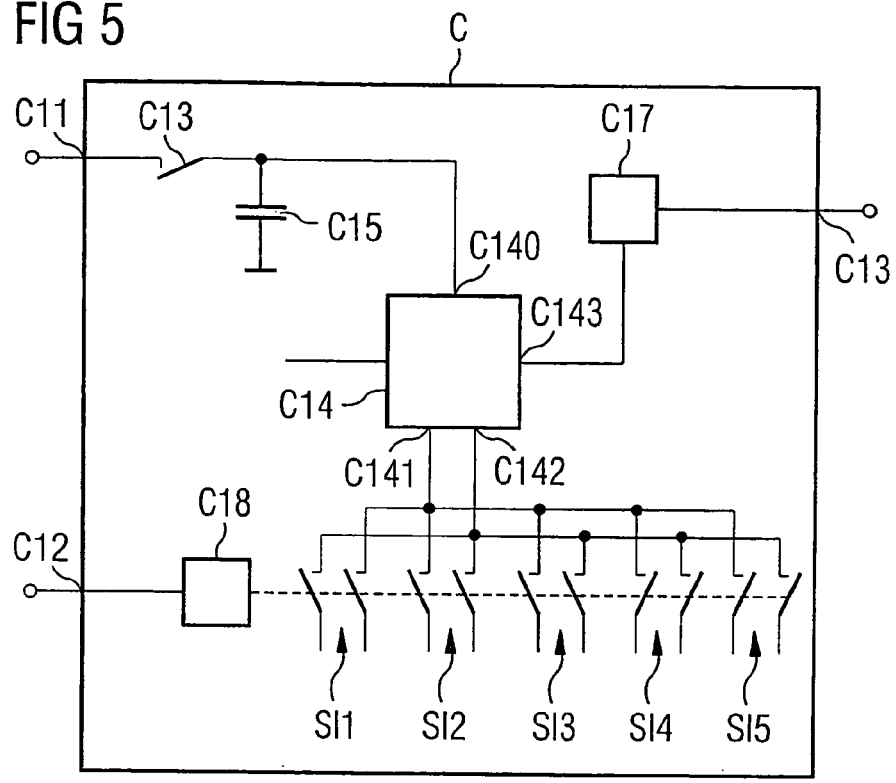
FIG. 5 shows a block diagram of a comparison circuit in a converter stage according to the invention.

This control signal is used to control the switches 9, 10, 11, 13 and 14 in the generator circuit P1 and is supplied to the logic circuit L1. At the same time, the control signal controls the selection of the reference voltage pair which is to be used in the comparison circuit in the second converter stage. A simple block diagram of the comparison circuit in the second converter stage can be seen in FIG. 5.

The input C11 is connected to a capacitor C15 via a switch C13. A second connection on the capacitor C15 is connected to the ground potential or to a reference potential. In addition, the switch C13 is routed to an input C140 on a comparison circuit C14. Furthermore, the comparison circuit C14 contains two further inputs C141 and C142, to which a respective reference voltage element from a reference voltage pair SI1 to SI5 is supplied. The respective reference voltage pair is applied to the inputs by means of switches which are controlled by a control circuit C08. The choice of switches is made by the control circuit C08 after evaluating a control signal applied to the control input C12. The two voltage elements divide the input voltage range into three voltage subranges. The comparison circuit C14 now ascertains, during a holding phase, which of the three voltage subranges contains the level of the sampled signal which is stored in the capacitor C15. A signal which is output at the output C143 is evaluated by a circuit C14 and a control signal is produced therefrom. This signal is output at the output C13, which simultaneously forms the control output S11 of the second converter stage T1.

The control signals from the individual comparison circuits C0, C1, C2 and C3 are supplied to a logic circuit L1. The logic circuit interprets the individual control signals as a sequence of serial bits which it assembles to form a digital value. The digital value is output at the output of the logic circuit as soon as all of the comparison circuits C0 to C3 have delivered a control signal. Since the inventive analog/digital converter operates in a clocked mode of operation, the comparison circuit C0 in the converter stage T0 is already producing a control signal for a new input voltage value again, while the comparison circuit C1 is delivering a control signal for the preceding input voltage value. It is therefore necessary for the logic circuit L1 to have a buffer store which buffer-stores all control signals and hence the bit sequences derived therefrom for input voltage signals which have not yet been processed completely. In the exemplary embodiment in FIG. 2, an input voltage value has passed through all four converter stages after four holding phases, and the logic circuit contains four control signals, which it assembles to form an associated digital value. This concept is called pipelining.

FIG. 9 shows a detail from a method of operation for an analog/digital converter based on the invention which comprises eight converter stages. The converter stages are in the form of sample-and-hold circuits, which means that a control signal is produced by each converter stage in a holding phase. After a total of eight control signals have been produced, the logic circuit generates serial bit sequences therefrom which it assembles to form a digital value. The digital value has an accuracy of 8 bits. Hence, a total of seven approximation steps are needed, each approximation step comprising a comparison operation and production of a new signal derived from the preceding approximation step. Each approximation step is carried out in a converter stage in the inventive analog/digital converter.

By way of example, a signal applied to the input E of the analog/digital converter needs to be converted from 0.9 V into the associated digital value. The first time period Φ1 is the sampling phase ΦS in the first converter stage T0. The generator circuit P0 and the comparison circuit C0 therefore sample the input signal of 0.9 V during this time phase. In the subsequent second time period Φ2, the signal is held by the first generator circuit P0 and is sampled by the second generator circuit P1 and the second comparison circuit C1. The holding operation in the first generator circuit P0 is denoted by H, and the sampling operation in the generator circuit P1 and in the comparison circuit C1 is denoted by S. The second phase Φ2 is therefore the holding phase ΦS in the first converter stage and the sampling phase in the second converter stage T1. During the second time phase Φ2, the comparison circuit C0 in the converter stage T0 makes a decision D regarding which voltage range contains the input voltage of 0.9 V. The sampled input voltage of 0.9 V is higher than 0.75 V, but lower than 1 V, and is therefore in the range between 0.75 V and 1 V. As can be seen in table 1, this is the range identified by the control signal "Overload". The comparison circuit C0 in the converter stage T0 is available for making decisions for the full second time period Φ2. This is possible because the generator circuit P1 and the comparison circuit C1, which need information from the comparison circuit C0, merely sample the latter's input signal during the second time period Φ2.

At the end of the second time period Φ2 or the holding phase ΦH, the comparison circuit C0 in the first converter stage T0 produces the control signal "Overload" and forwards it to the generator circuit P1 and to the comparator circuit C1 in the second converter stage. At the same time, this control signal is buffer-stored in the logic circuit L1. The generator circuit P1 in the second converter stage T1 takes the control signal "Overload" as a basis for producing a new voltage signal and outputs this signal at its output during the third time period F3. As can be seen from table 4, this is done by closing the switches 9 and 14. The output of the second converter stage T1 outputs a signal with a level of −0.2 V.

This is obtained from the difference between the double value of the input voltage of 0.9 V minus the double level of the reference voltage VREF=1 V. The signal which is output in this manner is resampled by the generator circuit P2 and the comparison circuit C2 in the second converter stage. At the same time, the comparison circuit C1 in the second converter stage T1 has selected the reference voltage pair associated with the control signal "Overload" and has carried out a comparison between the input signal and the two voltage elements. The two reference voltage elements of 7/8 VREF and 9/8 VREF divide the entire input voltage range between −1 V and +1 V into three voltage subranges. In this case, the level of the sampled signal of 0.9 V is higher than 7/8 VREF but lower than 9/8 VREF. The level of the sampled signal of 0.9 V is therefore between the two reference voltage elements. At the end of the third time period, the comparison circuit C1 in the second converter stage T1 therefore outputs the control signal "Fuzzy" at its output. This control signal is used to set the switches in the third generator circuit P2.

During the fourth time period F4, the amplifier V2 is switched into the signal paths in the third generator circuit P2. Hence, the second generator circuit's output A2 produces a signal with a level of −0.4 V. This signal is simultaneously sampled during the fourth time period F4 by the fourth generator circuit P3 in the fourth converter stage T3. In addition, during this time period the sampled stored signal is compared with the two reference voltage elements determined by the control signal "Fuzzy".

To this end, the generator circuit C2 again has the period of time period F4 available. A comparison reveals that the sampled voltage of −0.2 V is lower than −1/8 VREF, that is to say lower than −1/8 V. At the end of the fourth time period, the control signal "Low" is thus produced by the comparison circuit C2 in the third converter stage T2 and is output at the output.

In the subsequent fifth time period F5, the amplifier V2 is connected to the generator circuit P3. The generator circuit P3 generates an output signal of 0.2 V using the switches 25 closed by the control signal "Low" from the third comparison circuit C2. In the course of the fifth time period, the comparison circuit C3 ascertains the control signal by comparing the sampled stored signal of −0.4 V with the two reference voltage elements of −3/8 VREF and −5/8 VREF. The two reference voltage elements are part of the reference voltage pair SI4 in table 2. At the end of the fifth time period, the comparison circuit produces the control signal "Fuzzy" and forwards it to the subsequent fourth converter stage and to the logic circuit L1.

The fourth converter stage T4 and the fifth converter stage T5 (not shown here) likewise have an amplifier which they use jointly. In the exemplary embodiment illustrated here, with a total of eight converter stages, only four amplifiers are therefore required. After a total of nine time periods, the input signal of 0.9 V has been sampled by all of the converter stages and a respective control signal has been produced therefrom. This signal has been transmitted to the logic circuit, buffer-stored and converted into a digital value thereby. The control signals transmitted by the comparison circuits C0 to C7, and the associated subsequences of bits, can be seen in table 5 below.

TABLE 5

| | control signals from the comparison circuits for the input signal 0.9 V | |
|---|---|---|
| Stage | Control signal | Bit sequence (MSB, MSB$_{-1}$), (Underload, Overload) |
| C0 | "Overload" | (0, 0), (0, 1) |
| C1 | "Fuzzy" | (0, 1) |
| C2 | "Low" | (0, 0) |
| C3 | "Fuzzy" | (0, 1) |
| C4 | "High" | (1, 0) |
| C5 | "Fuzzy" | (0, 1) |
| C6 | "Low" | (0, 0) |
| C7 | "Fuzzy" | (0, 1) |

The subsequences are the same as in table 1. In this case, the first bit of the subsequence is the significant bit MSB for this approximation step. The second bit is a 1 in the "Fuzzy" range only, and in all others it is a 0.

From these eight bit sequences, a digital number is calculated using the respective first bit pair. To this end, the bits in each approximation step or in each converter stage are added. However, it should be remembered that the individual converter stages and the control signals they produce and the bit sequences extracted therefrom have different significances. The bit sequence extracted by the first converter stage T0 has the highest significance, which decreases with rising converter stages. Starting at the first two bits (0, 0) in the first bit sequence, addition therefore results in an intermediate value of 00110010+1 and hence the decimal value 51.

In addition, the logic circuit is also given an indication, by the control signal from the first comparison circuit C0, that the input signal was in the "Overload" range. This is indicated by the second bit sequence (0, 1). It is therefore necessary to add the binary value $2^{m-2}$ to this digital intermediate value 51 obtained in this manner. In this case, the variable m is the number of digits in the binary digital value or the accuracy, in the exemplary embodiment the value 8. Hence, the correct digital result obtained is the value 51+64=115. If the first control signal is "Underload", then the binary number $2^{m-2}$ is subtracted for the intermediate value obtained.

The analog/digital converter illustrated here not only reduces the current drawn by virtue of the jointly used amplifiers, but also permits significantly higher clock rates with its first converter stage T0. This is possible because a decision for the signal to be produced in a generator circuit is made in a comparison circuit in the preceding converter stage. The comparison circuit in the preceding converter stage therefore keeps the entire sampling period in the generator circuit available as a period for making a decision. In addition, the division into a total of five voltage subranges in the first comparison circuit significantly increases the dynamic range of the input range. In this case, the generator circuit P1 always converts the input signal in the range between −1 V and +1 V and an output signal in the range between 0.5 and −0.5 V. Conversely, this means that a supply voltage, particularly for the amplifiers in the downstream generator circuits, can be reduced without needing to take on the drawbacks entailed by amplifying large input signals at too low a supply voltage.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

The invention claimed is:

1. An analog/digital converter for converting an analog input signal into a digital value, comprising:
   a first converter stage comprising an input and a signal output, the first converter stage further comprising:
      a comparison circuit configured to compare a signal amplitude of a signal applied to the input of the first converter stage with amplitudes of at least two reference signal elements, and configured to output a first control signal to a control output of the first converter stage in response thereto;
      a generator circuit configured to output a signal derived from a level of the signal applied to an input thereof to an output of the generator circuit of the first converter stage;
   a second converter stage connected downstream of the first converter stage, the second converter stage comprising:
      a control input configured to receive the first control signal, the control input connected to the control output of the first converter stage;
      a signal input connected to the signal output of the first converter stage;
      a signal output;
      a comparison circuit configured to compare a signal amplitude for an input signal applied to the input of the second converter stage with amplitudes of two reference signals, and configured to output a second control signal to a control output of the second converter stage, wherein the amplitudes of the two reference signals in the second converter stage are determined by the first control signal at the control input; and
      a generator circuit configured to output an output signal derived from a level of the input signal at the input and from the first control signal at the control input to an output of the generator circuit of the second converter stage;
   an evaluation circuit connected to the control outputs of the first and second converter stages, respectively, and configured to ascertain a digital value from the first and second control signals; and
   an amplification device comprising an input coupled via a first switching device in a first switching state to the output of the generator circuit in the first converter stage and in a second switching state to the output of the generator circuit in the second converter stage, comprising an output coupled to the signal output of the first converter stage and to the signal output of the second converter stage.

2. The analog/digital converter as claimed in claim 1, wherein the output of the amplification device is coupled via a second switching device in a first switching state to the signal output of the first converter stage and in a second switching state to the signal output of the second converter stage.

3. The analog/digital converter as claimed in claim 2, wherein the first and second converter stages comprise sample-and-hold circuits for clocked operation, wherein the first and second switching devices are configured to be in the second switching state during a first time period, and in the first switching state during a second time period.

4. The analog/digital converter as claimed in claim 1, wherein the comparison circuit in the first converter stage comprises an input range for the input signal that is prescribed by an upper and a lower level limit value, the input range being divided into at least five subranges by at least four reference signal elements, and wherein the comparison circuit in the first converter stage is configured to ascertain which of the at least five subranges contains the amplitude of the input signal.

5. The analog/digital converter as claimed in claim 1, wherein the comparison circuit in the second converter stage comprises a signal range for the signal applied to the signal input that is prescribed by an upper and a lower limit value, the two reference signals dividing the signal range into three signal subranges, and wherein the comparison circuit in the second converter stage is configured to use a comparison of the input signal and the two reference signals to ascertain which of the three signal subranges contains the input signal.

6. The analog/digital converter as claimed in claim 1, wherein the two reference signals in the second converter stage form a reference signal pair, wherein the comparison circuit in the second converter stage is configured to choose the reference signal pair from a set of at least five reference signal pairs on the basis of the first control signal applied to the control input of the second converter stage.

7. The analog/digital converter as claimed in claim 1, wherein the comparison circuit in the second converter stage is configured to sample a signal applied to the signal input during a first time period and compare a level of the sampled signal with the levels of the two reference signals that form a reference signal pair, and further configured to output the second control signal that is dependent on the comparison during a second time period.

8. The analog/digital converter as claimed in claim 1, wherein the comparison circuit in the first converter stage is configured to sample an input signal during a first time period and compare a level of the sampled input signal with the levels of the at least four reference signal elements, and further configured to output the first control signal that is dependent on the comparison during a second time period.

9. The analog/digital converter as claimed in claim 8, wherein the second period in the first converter stage forms the first period in the second converter stage.

10. The analog/digital converter as claimed in claim 1, wherein the generator circuits in the first and second converter stages are configured to provide difference signal processing, wherein each generator circuit comprises a first signal path for a first signal element and a second signal path for a second signal element that is the inverse of the first signal element, and wherein the amplification device comprises an input with two connections and an output with two taps, wherein in the first switching state the first connection and the first tap of the amplification device is connected to the first signal path in the first generator circuit, and the second connection and the second tap of the amplification device is connected to the second signal path in the first generator circuit, and in the second switching state the first connection and the first tap of the amplification device is connected to the second signal path in the second generator circuit, and the second connection and the second tap of the amplification device is connected to the first signal path in the second generator circuit.

11. The analog/digital converter as claimed in claim 1, wherein the analog/digital converter is configured to provide signal processing with reference voltages and reference voltage elements that are formed by referring all potentials to a common reference potential.

12. A method for operating an analog/digital converter, analog/digital converter comprising:
  a first converter stage comprising an input and a signal output, the first converter stage further comprising:
    a comparison circuit configured to compare a signal amplitude of a signal applied to the input of the first converter stage with amplitudes of at least two reference signal elements, and configured to output a first control signal to a control output of the first converter stage in response thereto;
    a generator circuit configured to output a signal derived from a level of the signal applied to an input thereof to an output of the generator circuit of the first converter stage;
  a second converter stage connected downstream of the first converter stage, the second converter stage comprising:
    a control input configured to receive the first control signal, the control input connected to the control output of the first converter stage;
    a signal input connected to the signal output of the first converter stage;
    a signal output;
    a comparison circuit configured to compare a signal amplitude for an input signal applied to the input of the second converter stage with amplitudes of two reference signals, and configured to output a second control signal to a control output of the second converter stage, wherein the amplitudes of the two reference signals in the second converter stage are determined by the first control signal at the control input; and
    a generator circuit configured to output an output signal derived from a level of the input signal at the input and from the first control signal at the control input to an output of the generator circuit of the second converter stage;
  an evaluation circuit connected to the control outputs of the first and second converter stages, respectively, and configured to ascertain a digital value from the first and second control signals; and
  an amplification device comprising an input coupled via a first switching device in a first switching state to the output of the generator circuit in the first converter stage and in a second switching state to the output of the generator circuit in the second converter stage, comprising an output coupled to the signal output of the first converter stage and to the signal output of the second converter stage, the method comprising:
  establishing, during a first time period, the first switching device in the second switching state;
  sampling, during the first time period, with the generator circuit in the first converter stage a signal applied to the input of the first converter stage;
  outputting, during the first time period, at the output of the generator circuit in the second converter stage a signal which is derived from a control signal at the control input and from a sampled signal, wherein the output signal is amplified by the amplification device and supplied to the signal output of the second converter stage;
  establishing, during a second time period, the first switching device in the first switching state;
  outputting, during the second time period, at the output of the generator circuit in the first converter stage a signal that is derived from the sampled signal, and this signal is amplified by the amplification device, and supplying the signal to the signal output of the first converter stage; and
  sampling, during the second time period, the signal applied to the input of the second converter stage with the generator circuit in the second converter stage.

13. The method as claimed in claim 12, wherein the analog/digital converter further comprises a second switching device configured to couple the output of the amplification device to the signal output of the first converter stage in a first switching state, and couple the output of the amplification device to the signal output of the second converter stage in a second switching state, the method further comprising:

maintaining the second switching state of the second switching device during the first time period; and maintaining the first switching state of the second switching device during the second time period.

14. The method as claimed in claim 13, further comprising:

sampling, during the first time period, a signal applied to the input of the first converter stage with the comparison circuit in the first converter stage;

comparing a signal amplitude of a sampled signal during the first time period with the comparison circuit in the second converter stage with two reference signal amplitudes, wherein the two reference signal amplitudes are determined by the first control signal;

producing a second control signal during the first time period with the comparison circuit in the second converter stage based on the comparison, and outputting the second control signal at the control output of the comparison circuit of the second converter stage;

comparing the signal amplitude of the sampled signal during the second time period with the comparison circuit in the first converter stage with at least two reference signal amplitudes; and producing the second control signal during the second time period with the comparison circuit in the second converter stage based on the comparison in the second converter stage and outputting the second control signal at the control output of the second converter stage.

15. The method as claimed in claim 14, further comprising comparing during the second time period with the comparison circuit in the first converter stage the signal amplitude of the sampled signal with at least four reference signal amplitudes.

16. The method as claimed in claim 14, wherein the two reference signal amplitudes in the comparison circuit in the second converter stage form a reference signal pair that is selected from a set of five reference signal pairs during the first time period on the basis of the first control signal from the comparison circuit in the first converter stage.

17. The method as claimed in claim 14, wherein the reference signal amplitudes in the comparison circuit in the second converter stage each comprise a fraction of a first reference signal amplitude, wherein each respective fraction comprises m times an eighth part of the first reference signal amplitude, wherein m comprises an uneven integer between −9 and 9.

18. The method as claimed in claim 17, wherein the two reference signal amplitudes comprise a level difference of two eighths of the first reference potential.

19. The method as claimed in claim 12, wherein during the first time period the signal derived from the first control signal at the control input of the second converter stage and from the sampled signal is produced by doubling an amplitude of the input signal or doubling input signal amplitude and adding or subtracting an intermediate signal thereto or therefrom, respectively, based on the first control signal, wherein the intermediate signal is derived from a level associated with a first reference potential.

* * * * *